United States Patent
Machida et al.

(10) Patent No.: US 6,171,871 B1
(45) Date of Patent: Jan. 9, 2001

(54) FERROELECTRIC MEMORY DEVICE AND THEIR MANUFACTURING METHODS

(75) Inventors: Akio Machida; Naomi Nagasawa; Takaaki Ami; Masayuki Suzuki, all of Kanagawa (JP)

(73) Assignee: Sony Corporation, Tokyo (JP)

( * ) Notice: Under 35 U.S.C. 154(b), the term of this patent shall be extended for 0 days.

(21) Appl. No.: 09/078,678

(22) Filed: May 14, 1998

(30) Foreign Application Priority Data

May 16, 1997 (JP) .................................................. 9-143126

(51) Int. Cl.$^7$ .................................................. H01L 21/00
(52) U.S. Cl. .................................. 438/3; 257/295; 438/4
(58) Field of Search ........................... 438/3, 4; 257/295; 349/172, 433

(56) References Cited

U.S. PATENT DOCUMENTS

| | | |
|---|---|---|
| 4,714,848 | 12/1987 | Chen . |
| 5,155,658 | 10/1992 | Inam et al. . |
| 5,607,632 | * 3/1997 | Neurgaonkar et al. ................. 264/61 |
| 5,998,910 | * 12/1999 | Park et al. ............................. 310/358 |

FOREIGN PATENT DOCUMENTS

| | | |
|---|---|---|
| 0 766 296 A2 | 4/1997 | (EP) . |
| 4-51022 | * 2/1992 | (JP) . |

OTHER PUBLICATIONS

Patent Abstracts of Japan, vol. 018, No. 078 (P–1689), Feb. 8, 1994 & JP 05 289081 A (Idemitsu Kosan Co Ltd), Nov. 5, 1993.

Masayuki Suzuki, et al.: "Preparation of Layered Ferroelectric $Bi_2SrTa_2O_9$ Single–Crystal Platelets" Japanese Journal of Applied Physics, Part 2 (Letters), May 1, 1996, Publication Office, Japanese Journal Appl. Phys, Japan, vol. 35, No. 5A, ISSN 0021–4922, pp. L564–L567, XP000626563.

* cited by examiner

*Primary Examiner*—Sara Crane
(74) *Attorney, Agent, or Firm*—Sonnenschein, Nath & Rosenthal

(57) ABSTRACT

It is intended to provide a ferroelectric that exhibits superior ferroelectricity. A ferroelectric provided is an oxide having a layered crystal structure that is composed of Bi, a first element Me, a second element R, and O. The first element Me is at least one element selected from the group consisting of Na, K, Ca, Ba, Sr, Pb, and Bi. The second element R is at least one element selected from the group consisting of Fe, Ti, Nb, Ta, and W. Ninety-eight percent or more of the entire body of the ferroelectric exhibits ferroelectricity. After an oxide having a layered crystal structure has been grown by a vapor-phase method (crystal growth step), electrodes are attached to the oxide having a layered crystal structure and a voltage is applied thereto (voltage application step). As a result, strains of crystal lattices are corrected at least partially, whereby portions that did not exhibit ferroelectricity at all or did not exhibit superior ferroelectricity due to such large strains that the symmetry of crystal lattices is lost are changed so as to exhibit superior ferroelectricity.

11 Claims, 10 Drawing Sheets

◯ : Bi   ◉ : Me   ◉ : R   ○ : O

US 6,171,871 B1

FERROELECTRIC MEMORY DEVICE AND THEIR MANUFACTURING METHODS

BACKGROUND OF THE INVENTION

1. Field of the Invention

The present invention relates to ferroelectrics such as oxides having a layered crystal structure that belong to what is called the aurivillius crystallographic group and that tend to have strains in crystal lattices. The invention also relates to a memory device using such a ferroelectric and manufacturing methods of the ferroelectric and the memory device.

2. Description of the Related Art

Ferroelectrics have hysteresis in their electric field vs. polarization characteristic. Based on this fact, proposals for realizing, by utilizing ferroelectrics, nonvolatile memory devices that can hold data without being backed up by a power supply were made in 1960's. However, the attempts to develop such nonvolatile memory devices were stopped because at that time the ferroelectric thin film forming technology has not been established yet and there occurred various problems such as interference between memory cells. However, because of marked improvements in the thin-film technology that occurred thereafter, in recent years attempts to develop nonvolatile memory devices utilizing ferroelectrics have become active again. (For example, refer to C. Araujo, J. Scott, R. Goddfrey, and L. McMillan, Appl. Phys. Lett., 48 (1986) 1439; and W. Kinney, W. Shepherd, W. Miller, J. Evans, and R. Womack, IEDM Tech. Dig., (1987) 850.)

Among ferroelectrics to constitute nonvolatile memory devices, bismuth strontium tantalate ($Bi_2SrTa_2O_9$; hereinafter referred to as "BiSTa") particularly attracts attention which belongs to what is called the aurivillius crystallographic group and is superior in fatigue characteristic. (For example, refer to C. A-Paz de Araujo, J. D. Cuchiaro, L. D. McMillan, M. C. Scott, and J. F. Scott, Nature, 374 (1995) 627; K. Amanuma, T. Hase, and Y. Miyasaka, Appl. Phys. Lett., 66 (1995), 221; and S. B. Desu and D. P. Vijay, Master Sci. and Eng., B32 (1995) 75.) The aurivillius crystallographic group includes crystals that are represented by a stoichiometric composition formula $[Bi_2O_2]^{2+1}[Me_{m-1}R_mO_{3m+}]^{2-}$ where m is an integer of 2 or more, Me is at least one element selected from the group consisting of sodium (Na), potassium (K), calcium (Ca), barium (Ba), strontium (Sr), lead (Pb), and bismuth (Bi), R is at least one element selected from the group consisting of iron (Fe), niobium (Nb), tantalum (Ta), and tungsten (W).

Recently, there have been made reports of successes in producing a BiSTa thin film by MOCVD (metal organic chemical vapor deposition). (Refer to T. Ami, K. Hironaka, C. Isobe, N. Nagel, M. Sugiyama, Y. Ikeda, K. Watanabe, A. Machida, K. Miura, and M. Tanaka, Mater. Res. Soc. Symp. Proc., 415 (1996) 195; and T. Li, Y. Zhu, S. B. Desu, C-H. Peng, M. Nagata, Appl. Phys. Lett. 68 (1996) 616.)

However, examinations of the characteristics of actually produced BiSTa single crystals revealed that one crystal had portions exhibiting anisotropy and portions not exhibiting anisotropy though these portions did not have any difference in composition. Further, observations with a transmission electron microscope (TEM) showed that portions not exhibiting anisotropy had such large strains that the symmetry of crystal lattices was lost. Similar lattice strain was found in BiSTa polycrystalline thin films by using a TEM. That is, it was found that materials having a complex crystal structure such as BiSTa have a problem that they tend to have such large strains that the symmetry of crystal lattices is lost and hence tend to have portions not exhibiting anisotropy and portions exhibiting anisotropy but not showing superior characteristics.

For the above reasons, when a memory device is formed by using a ferroelectric having a complex crystal structure such as BiSTa, its characteristics deteriorate depending on the volume ratio of portions not exhibiting anisotropy and portions not showing superior characteristics. Further, the device characteristics vary depending on the proportion of portions not exhibiting anisotropy and portions not showing superior characteristics.

SUMMARY OF THE INVENTION

The present invention has been made in view of the above problems, and an object of the invention is therefore to provide a ferroelectric that exhibits superior characteristics, a memory device using such a ferroelectric, and their manufacturing methods.

A ferroelectric according to the invention is such that 98% or more of the entire body exhibits ferroelectricity.

In a memory device according to the invention, a pair of electrodes are connected to a ferroelectric film, and 98% or more of a section of the ferroelectric film to which a voltage is to be applied via the electrodes is a ferroelectric exhibiting ferroelectricity.

A manufacturing method of a ferroelectric according to the invention comprises a crystal growth step of growing a crystal that is to constitute the ferroelectric; and a voltage application step of applying, after at least part of the crystal has been grown, a voltage to at least part of the crystal to at least partially correct strains of crystal lattices existing in the crystal.

According to the invention, a method for manufacturing a memory device in which a pair of electrodes are connected to a ferroelectric film, comprises a ferroelectric film forming step of forming a ferroelectric film; and a voltage application step of applying, after at least part of the ferroelectric film has been grown, a voltage to at least part of the ferroelectric film to at least partially correct strains of crystal lattices existing in the ferroelectric film.

In the above ferroelectric, 98% or more of the entire body exhibits ferroelectricity, whereby the ferroelectric exhibit superior characteristics.

In the above memory device, polarization occurs in the ferroelectric film when a voltage is applied between the pair of electrodes. The voltage vs. polarization characteristic of the ferroelectric film has hysteresis. Data storage and read-out are performed by utilizing the hysteresis. Superior characteristics can be obtained because the ferroelectric film is made of a ferroelectric in which 98% or more of the section of the ferroelectric film to which a voltage is applied via the electrodes exhibits ferroelectricity.

In the above manufacturing method of a ferroelectric, after at least part of a crystal to constitute the ferroelectric is grown in the crystal growth step, a voltage is applied to at least part of the crystal in the voltage application step. As a result, at least part of strains of crystal lattices existing in the crystal are corrected.

In the above manufacturing method of a memory device, after at least part of a ferroelectric film is formed in the ferroelectric film forming step, a voltage is applied to at least part of the ferroelectric film in the voltage application step. As a result, at least part of strains of crystal lattices existing in the crystal are corrected.

DETAILED DESCRIPTION OF THE PREFERRED EMBODIMENTS

The embodiments of the present invention will be hereinafter described in detail with reference to the drawings.

Embodiment 1

A ferroelectric according to this embodiment is a single crystal oxide having a layered crystal structure that is composed of bismuth, a first element Me, a second element R, and oxygen. The first element Me is at least one element selected from the group consisting of sodium, potassium, calcium, barium, strontium, lead, and bismuth. The second element R is at least one element selected from the group consisting of iron, titanium, niobium, tantalum, and tungsten. It is preferable that the first element Me be at least one element selected from the group consisting of strontium, lead, barium, and calcium and that the second element R be at least one element selected from the group consisting of niobium and tantalum. It is most desirable that the first element Me be strontium and the second element R be tantalum.

Chemical formula (1) is the stoichiometric composition formula of the above oxide having a layered crystal structure. However, the ferroelectric of this embodiment is not limited to the one having the stoichiometric composition and includes ones whose compositions are deviated from the stoichiometric composition.

$$[Bi_2O_2]^{2+}[Me_{m-1}R_mO_{3m+1}]^{2-} \quad (1)$$

where

Me: first element;

R: second element; and m: integer that is one of 2 to 5.

Figure 1:
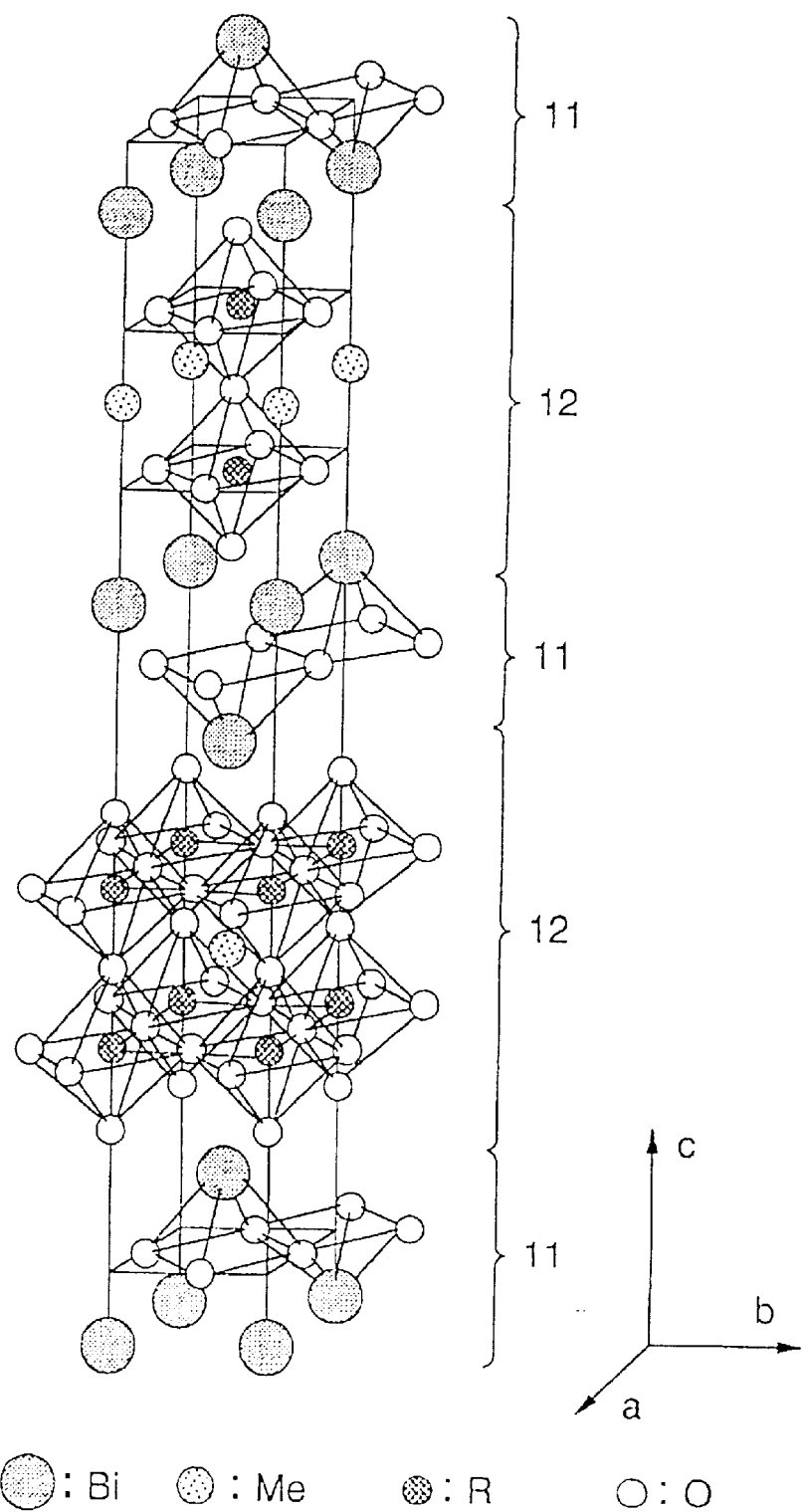
FIG. 1 is a conceptual diagram showing the crystal structure of an oxide having a layered crystal structure according to a first embodiment of the present invention.

FIG. 1 shows the crystal structure of an oxide having a layered crystal structure in which m is equal to 2 in the composition formula of chemical formula (1). As shown in FIG. 1, this oxide having a layered crystal structure is configured in such a manner that layers 11 corresponding to $(Bi_2O_2)^{2-}$ and layers 12 corresponding to $[MeR_2O_7]^{2-}$ are stacked alternately, and has anisotropic c-axis cleavage (refer to H. Maeda, Y. Tanaka, M. Fukutomi, and T. Asano, Jpn. J. Appl. Phys., 27 (1988) L209; and K. Hiraga, M. Hirabayashi, M. Kikuchi, and Y. Syono, Jpn. J. Appl. Phys., 27 (1988) L573). This oxide having a layered crystal structure also has a feature that the lattice constants of the a-axis and the b-axis are not equal to each other and hence the oxide exhibits ferroelectricity in a plane perpendicular to the c-axis.

This oxide having a layered crystal structure tends to have such large strains that the symmetry of crystal lattices is lost. Portions in which crystal lattices are strained are lowered in ferroelectric characteristic depending on the degree of strains, and do not exhibit ferroelectricity at all in some cases. However, in this ferroelectric, strains of crystal lattices are corrected at least partially and hence 98% or more of the entire body exhibits ferroelectricity.

The ferroelectric having the above constitution can be produced in the following manner.

First, a proper oxide material and bismuth oxide ($Bi_2O_3$) as flux are mixed with each other. A resulting mixture is put in a proper crucible and the crucible is then placed in a proper heating furnace, where heating and vaporization is effected. For example, the material is completely melted by performing first heating for a predetermined time at a temperature (for instance, 1,350° C.–1,500° C.) higher than or equal to the melting point of the mixture of the material and the flux. Then, the molten material is vaporized by performing second heating for a predetermined time at a temperature (for instance, 1,000° C.–1,300° C.) lower than the melting point. As a result, a single crystal of an oxide having a layered crystal structure is deposited from the vapor phase of the material on a deposition section that is provided at a proper position in the furnace (crystal growth step). The temperature of the deposition section is set somewhat (for instance, about 5° C.–20° C.) lower than the material heating temperature.

Then, after proper electrodes are attached to the thus-deposited single crystal oxide having a layered crystal structure, a voltage is applied to it in the direction perpendicular to the c-axis (voltage application step). As a result, strains of crystal lattices in the oxide having a layered crystal structure are corrected at least partially. That is, portions that did not exhibit ferroelectricity at all or did not exhibit superior ferroelectricity due to such large strains that the symmetry of crystal lattices is lost come to exhibit superior ferroelectricity.

The voltage applied in the voltage application step may be either an AC voltage or a DC voltage. Where a DC voltage is used, pulses of opposite electric field directions are applied alternately. It is preferable that the amplitude of the application voltage be such as to cause an electric field that is 1.5 times or more stronger than the coercive field. A larger application voltage provides a higher effect. During the voltage application, the oxide laving a layered crystal structure may be heated at a proper temperature or kept at the room temperature without heating it (i.e., no temperature adjustment is performed). However, since the coercive field decreases as the temperature increases, by heating the oxide a profound effect can be obtained even with a low application voltage. In this manner, a ferroelectric according to this embodiment is obtained.

Because 98% or more of the entire body exhibits ferroelectricity, the ferroelectric of this embodiment can be improved as a whole in ferroelectric characteristic. By forming a ferroelectric, nonvolatile memory device by using the ferroelectric of this embodiment, not only can the quality of the memory device be improved but also a variation in quality among memory device products can be reduced.

According to the manufacturing method of a ferroelectric of this embodiment, because a voltage is applied to a deposited oxide having a layered crystal structure, strains of crystal lattices in the oxide having a layered crystal structure can be corrected. Therefore, portions that did not exhibit ferroelectricity at all or did not exhibit superior ferroelectricity due to such large strains that the symmetry of crystal lattices is lost can be caused to exhibit superior ferroelectricity. Therefore, the ferroelectric of this embodiment can be realized easily.

More specific versions of the above ferroelectric and manufacturing method will be described below. That is, the following description will be directed to the case of manufacturing a ferroelectric that is an oxide having a layered crystal structure (BiSTa) that is composed of bismuth, strontium (first element Me), tantalum (second element R), and oxygen and has a stoichiometric composition represented by chemical formula (2).

$$[Bi_2O_2]^{2+}[SrTa_2O_7]^{2-} \quad (2)$$

First, powders of bismuth oxide, strontium carbonate ($SrCO_3$), and tantalum oxide ($Ta_2O_5$) as materials (each material was a highest-quality chemical produced by Kojundo Chemical Co.) were prepared and mixed with each other at a mole ratio of 79.0:10.5:10.5. Bismuth oxide was used as flux.

The above materials was put in a platinum crucible, which was in turn placed in an aluminum crucible. The lidded aluminum crucible was placed in a proper heating furnace and the materials were vaporized. Specifically, after the materials were melted by performing first heating at 1,350° C. for 20 hours, they were vaporized by performing second heating at 1,200° C. for 850 hours. Crystals were deposited by using a top portion of the side wall of the platinum crucible as a deposition section. As a result, a plurality of crystals were deposited on the top portion of the side wall of the platinum crucible (crystal growth step).

To confirm that the crystals obtained were BiSTa having ferroelectricity, the crystals (crystal-1 and crystal-2) were subjected to the following examinations: (1) identification analysis by X-ray diffraction, (2) surface observation with an optical microscope, (3) observation with a polarizing microscope under the crossed Nicols condition to check whether the crystal belonged to the orthorhombic system, (4) chemical composition analysis by EPMA, and (5) observation of ferroelectric hysteresis. An X-ray diffraction apparatus Rigaku RAD-IIIB was used for the X-ray diffraction of item (1). As for the EPMA, a wavelength dispersive X-ray spectroscopy (WDS) analysis was conducted by using CAMEBAXSX-50. Results of the above examinations will be described below.

Figure 2:
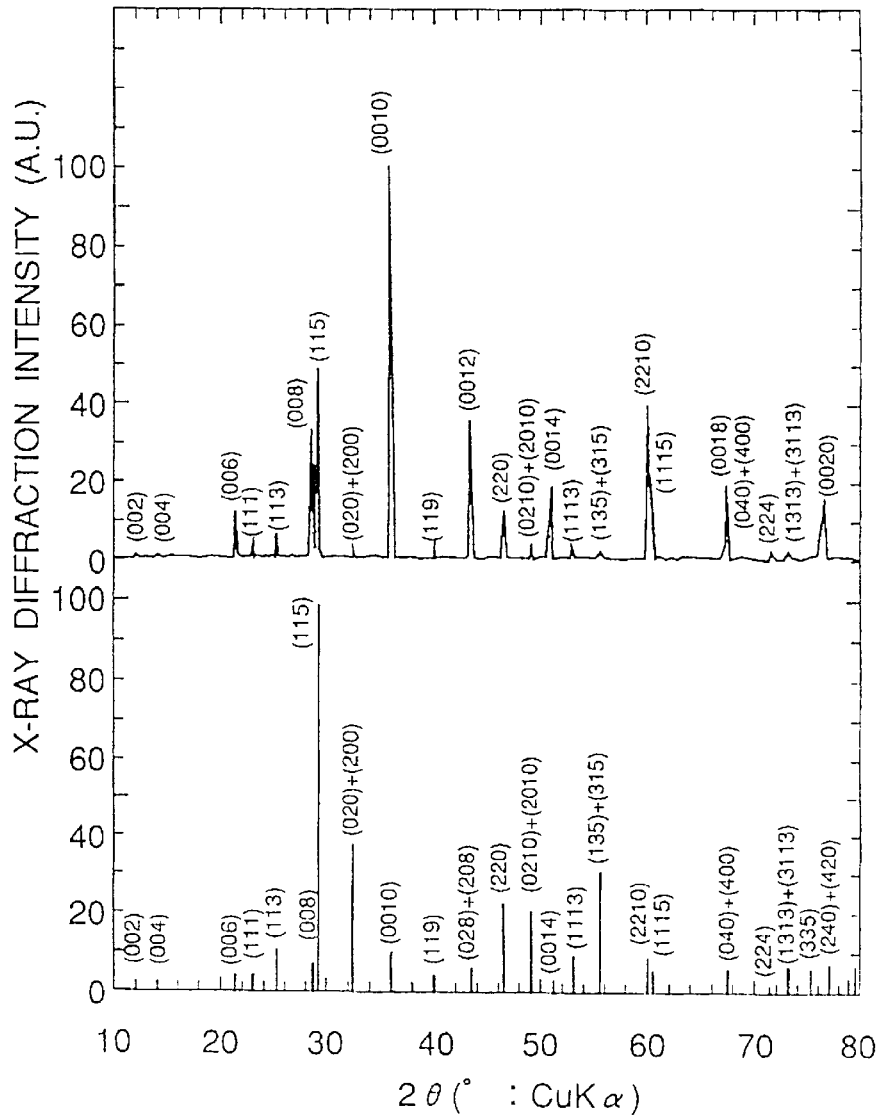
FIGS. 2A and 2B show an X-ray diffraction pattern that indicates composition of crystal-1 and a Rietveld simulation pattern, respectively.

(1) Results of X-ray diffraction analysis:

FIGS. 2A and 2B show an X-ray diffraction pattern (XRDP) of crystal-1 and a Rietveld simulation pattern, respectively. This Rietveld simulation pattern is a reference pattern of BiSTa calculated by Rietveld simulation based on the lattice constants that were obtained by Rae et al. (a=0.553065 nm, b=0.553445 nm, and c=2.49839 nm; A. D. Rae, J. G. Thompson, and R. L. Withers, Acta. Cryst., B48 (1992) 418.) In doing the Rietveld simulation, the space group "Fmmm" was used rather than "A2$_1$am" that was the assertion of Rae et al.

As seen from FIGS. 2A and 2B, the diffraction peaks of the XRDP of crystal-1 coincide with those of the Rietveld simulation pattern and hence it is confirmed that crystal-1 is BiSTa. Further, based on the fact that diffraction peaks (006), (0010), etc. of the XRDP of crystal-1 are higher than those of the Rietveld simulation pattern, it is found that crystal-1 has strong c-axis orientation due to its flake-like shape. Results similar to those with crystal-1 were obtained with crystal-2, though no figure is presented here.

Figure 3:
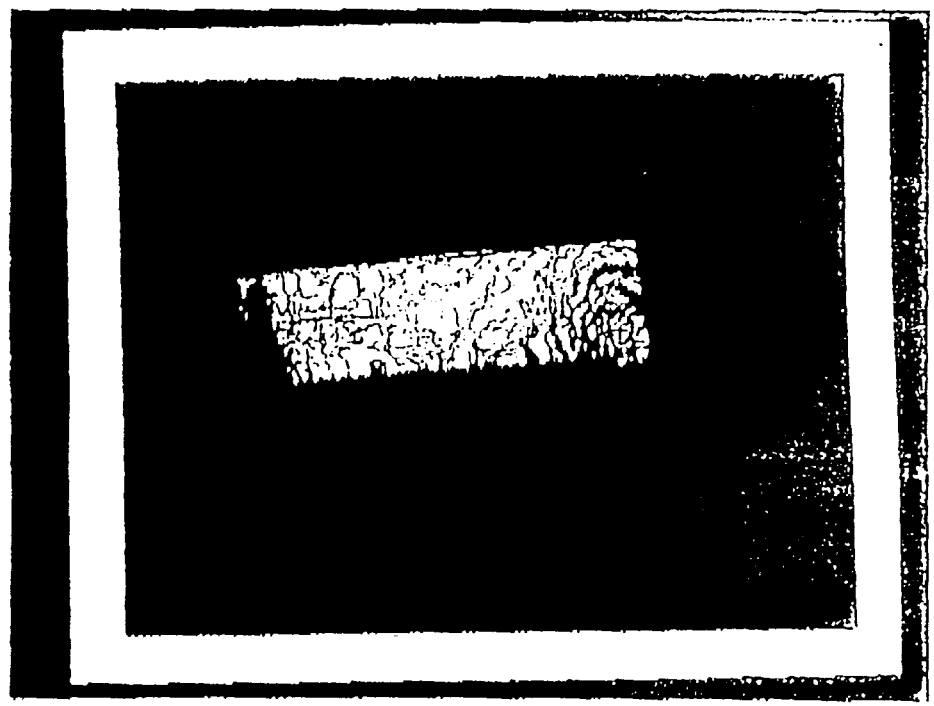
FIG. 3 is an optical microscope photograph showing the surface of crystal-1.

(2) Results of surface observation with optical microscope:

FIG. 3 is an optical microscope photograph of crystal-1. From FIG. 3, it is found that crystal-1 has a smooth surface. Since BiSTa has c-axis cleavage as understood from the crystal structure shown in FIG. 1, this smooth surface is considered to be the c-plane. Results similar to those with crystal-1 were obtained with crystal-2, though no figure is presented here.

Figure 4:
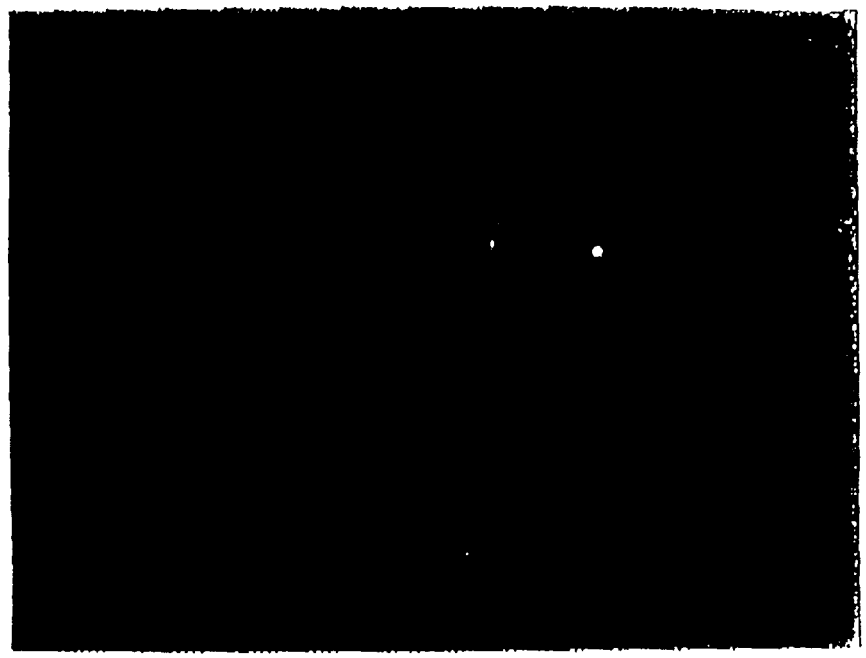
FIG. 4 is a polarizing microscope photograph taken under the crossed Nicols condition and showing a light and shade variation of crystal-1.
Figure 5:
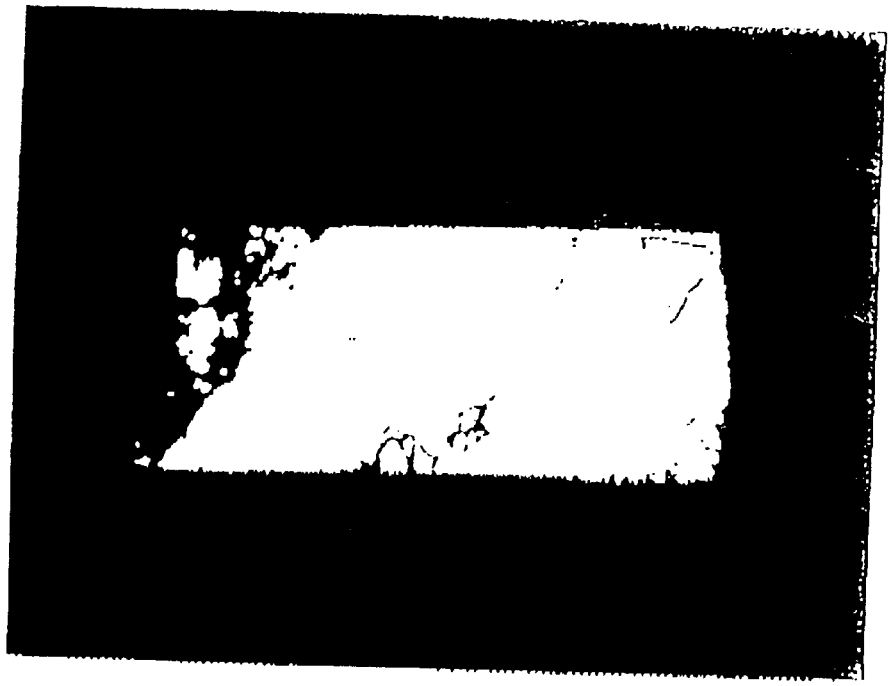
FIG. 5 is a polarizing microscope photograph taken under the crossed Nicols condition and showing a light and shade variation of crystal-1 in a state that crystal-1 was rotated by 45° from the state of FIG. 4.
Figure 6:
FIG. 6 is a polarizing microscope photograph taken under the crossed Nicols condition and showing a light and shade variation of crystal-2.

(3) Results of observation with polarizing microscope under crossed Nicols condition:

The crystal obtained was mounted on a rotary stage that is disposed between a pair of polarizers in the crossed Nicols condition. While the stage was rotated for the c-plane, it was checked whether a light and shade pattern occurred in synchronism with the rotation. A periodic light and shade response was observed with each of crystal-1 and crystal-2. FIGS. 4 and 5 are polarizing microscope photographs before and after crystal-1 was rotated by 45°. As seen from these figures, it is confirmed that the lattice constants of the a-axis and the b-axis are different from each other in both crystal-1 and crystal-2 (no figures are presented for crystal-2). Further, as seen from FIG. 5, crystal-1 had portions exhibiting a periodic light and shade response and portions not exhibiting such a response. This was also the case with crystal-2. In FIG. 5, the portions exhibiting a light and shade response are not clearly distinguished from the portions not exhibiting such a response. FIG. 6 is a polarizing microscope photograph of crystal-2 in which the two kinds of portions are clearly distinguished from each other.

(4) Results of chemical composition analysis by EPMA

Table 1 shows ratios in composition among bismuth, strontium, and tantalum. Although the composition of each of crystal-1 and crystal-2 is close to the stoichiometric composition as seen from Table 1, it was found that the composition of each of crystal-1 and crystal-2 was deviated from the stoichiometric composition slightly in such a degree that no difference was found in the X-ray diffraction patterns of item (1). It was also found that there was no difference in composition between portions exhibiting a light and shade response in the polarizing microscope observation under the crossed Nicols condition and portions not exhibiting such a response (see FIGS. 5 and 6) of item (4).

Table 1
Crystal-1: Bi:Sr:Ta=2.07:1.10:2.00
Crystal-2: Bi:Sr:Ta=2.10:1.01:2.00

(5) Results of observation of ferroelectric hysteresis:

Gold (Au) electrodes were evaporated on one surface (c-plane) of crystal-1 at an interval of 500 μm, and ferroelectric hysteresis was observed while a voltage of 820 V was applied in the direction perpendicular to the c-axis and the temperature was kept at 250° C. Further, gold electrodes were evaporated on one surface (c-plane) of crystal-2 at an interval of 100 μm, and ferroelectric hysteresis was observed while a voltage of 500 V was applied in the direction perpendicular to the c-axis and the temperature was kept at 200° C. A ferroelectric hysteresis loop was observed with both crystal-1 and crystal-2.

It was confirmed from the above results that both crystal-1 and crystal-2 are BiSTa single crystals having ferroelectricity. It was also found that each of crystal-1 and crystal-2 is uniform in terms of composition but has portions not exhibiting anisotropy (i.e., ferroelectricity). In view of this, crystals obtained were subjected to observation with a transmission electron microscope (TEM), whereby it was found that portions having disordered (strained) crystal lattices existed in orderly crystal lattices. The portions having disordered crystal lattices corresponded to the portions not exhibiting ferroelectricity.

Then, while a voltage was applied to each of crystal-1 and crystal-2 (voltage application step), it was observed how the crystal varied.

Figure 7:
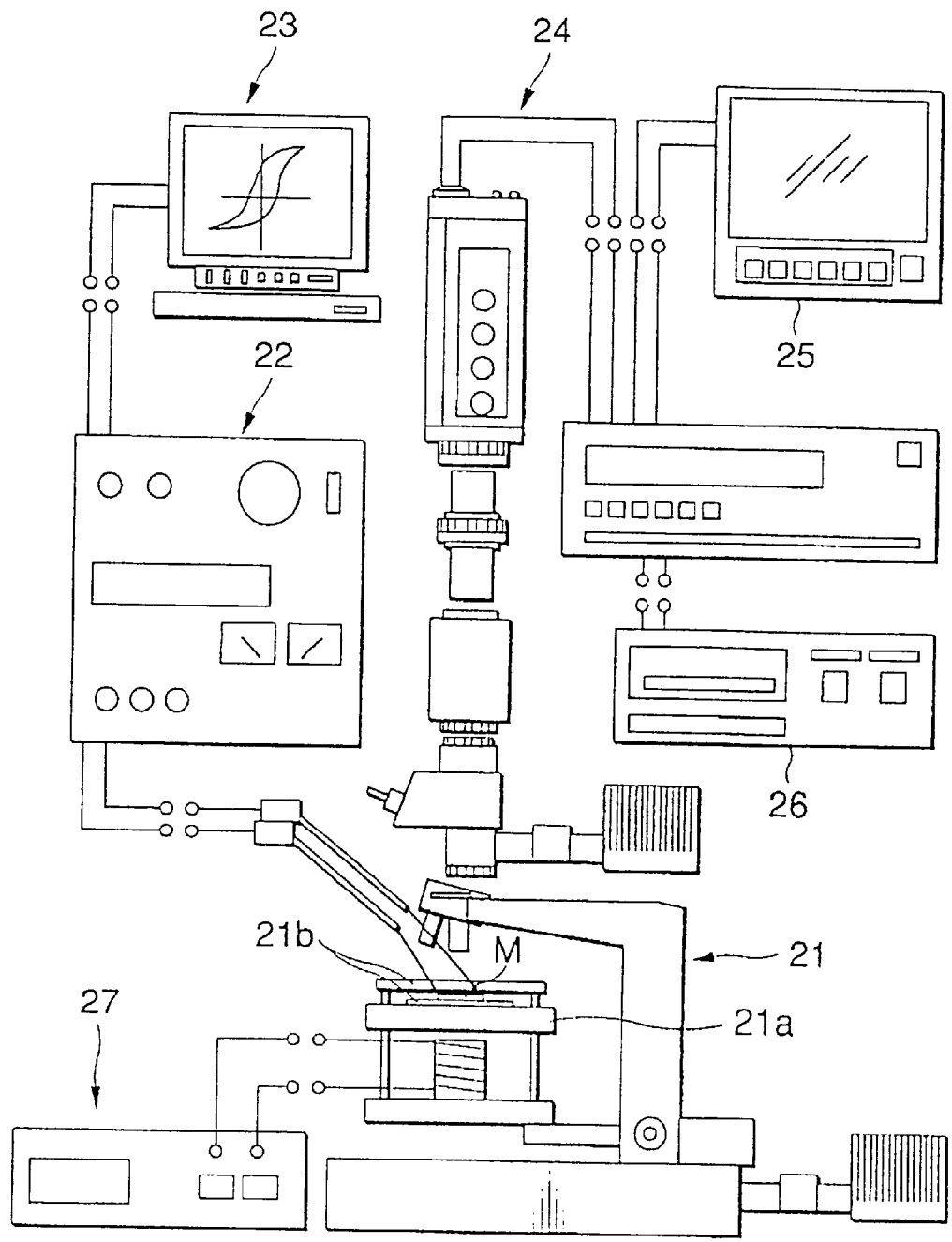
FIG. 7 shows the configuration of an apparatus used for observation of a crystal variation in a voltage application step.

FIG. 7 shows the configuration of an apparatus that was used for this observation. This apparatus is provided with a polarizing microscope 21 in which a pair of polarizers 21b are disposed in the crossed Nicols state so that a crystal M that is mounted on a rotary state 21a is interposed in between. The polarizing microscope 21 is connected to a voltage application device 22 for applying a voltage to the crystal M mounted on the rotary stage 21a. The voltage application device 22 is connected to a computer 23, to enable analysis of the electric field vs. polarization characteristic of the crystal M. A CCD camera 24 is disposed above the polarizing microscope 21 so that a variation of the crystal M during voltage application can be displayed on a screen 25 in an enlarged manner as well as output from a color video printer 26. The rotary stage 21a of the polarizing microscope 21 is connected to a temperature adjustment device 27, to enable adjustment of the temperature of the crystal M.

Figure 8:
FIGS. 8–10 are polarizing microscope photographs showing a variation in optical anisotropy of crystal-1 in the voltage application step.
Figure 9:

By using the above-configured apparatus, first, a DC voltage of about 820 V (corresponding to an electric field of about 16 kV/cm) was applied to crystal-1 that was mounted on the rotary stage 21a in the direction perpendicular to the caxis while heating was made by the temperature adjustment device 27 to set the temperature at 200° C. Then, a DC voltage of about 820 V was applied in such a manner that the electric field direction is reversed. At this time, the magnitude of the electric field was about 1.7 times larger than the coercive field. FIGS. 8 and 9 are polarizing microscope photographs of crystal-1 before and after voltage application, respectively. As seen from FIGS. 8 and 9, portions that did not exhibit, before the voltage application, a periodic light and shade response when the crystal was rotated under the crossed Nicols condition were partially changed by the voltage application so as to exhibit a light and shade response.

Figure 10:
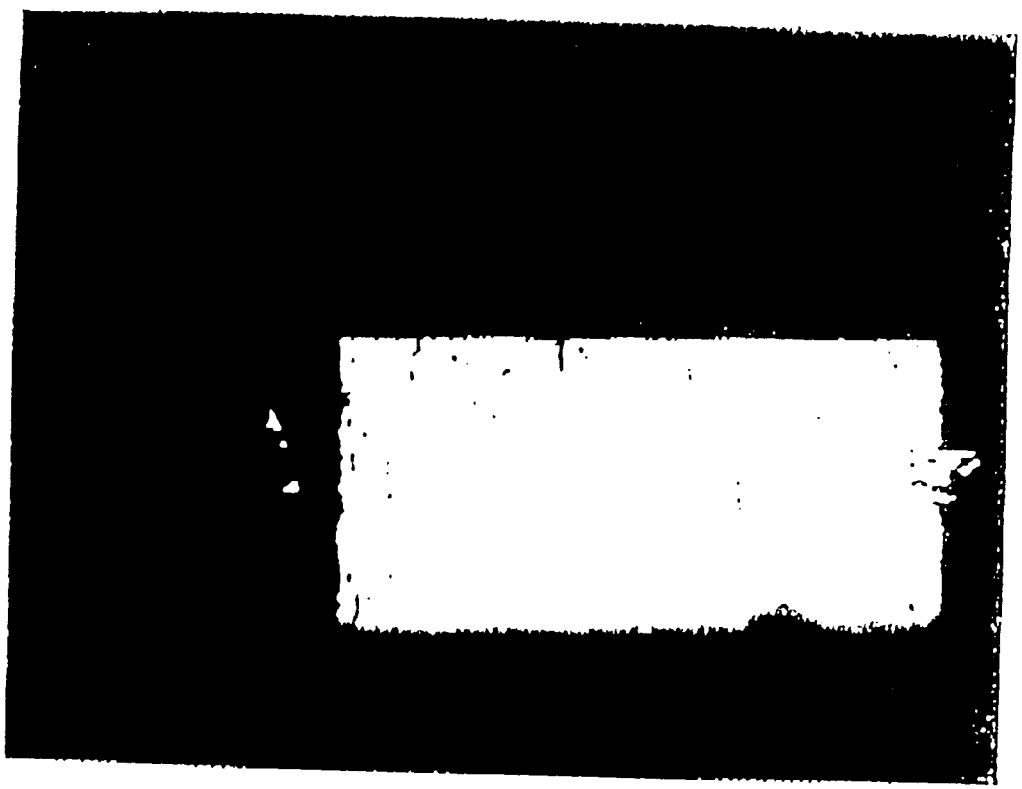

Then, a variation of crystal-1 was observed with the polarizing microscope 21 and the CCD camera 24 while an AC voltage of 60 Hz and about 820 V (corresponding to an electric field of about 16 kV/cm) was applied in the direction perpendicular to the c-axis and heating was made to set the temperature at 200° C. FIG. 10 is a polarizing microscope photograph of crystal-1 taken after the AC voltage was applied for 120 minutes. In this manner, the voltage application caused the portions that did not exhibit a periodic light and shade response when the crystal was rotated under the crossed Nicols condition to be gradually extended perpendicularly and thinned to the voltage application direction, and their areas to gradually decrease. Whereas before the voltage application the portions that exhibited a light and shade response accounted for about 80% of the entire body (see FIG. 8), after the application of the AC voltage for about 120 minutes such portions accounted for more than about 99% of the entire body.

Figure 11:
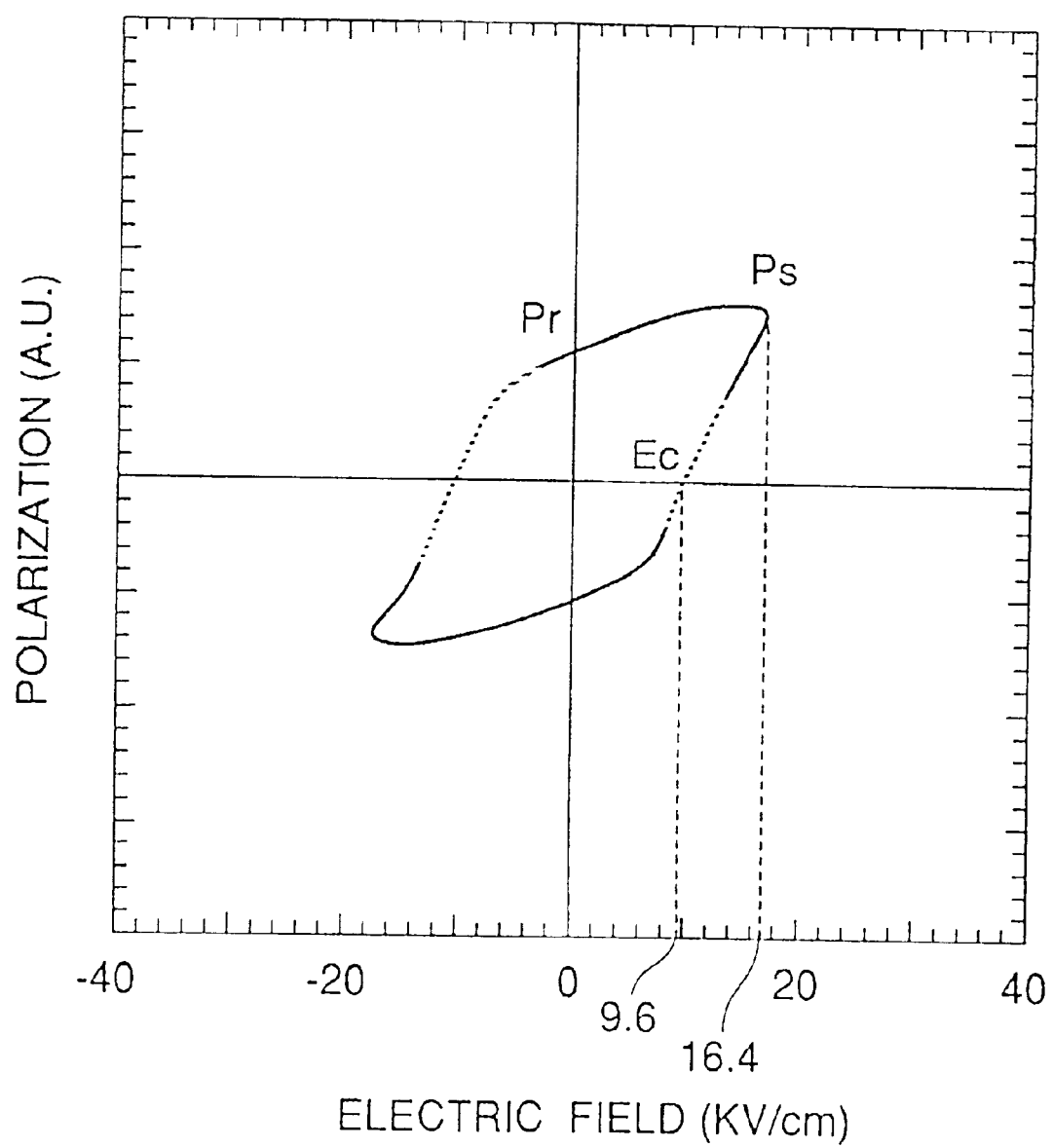
FIG. 11 is a graph showing a ferroelectric hysteresis loop of crystal-1.
Figure 12:
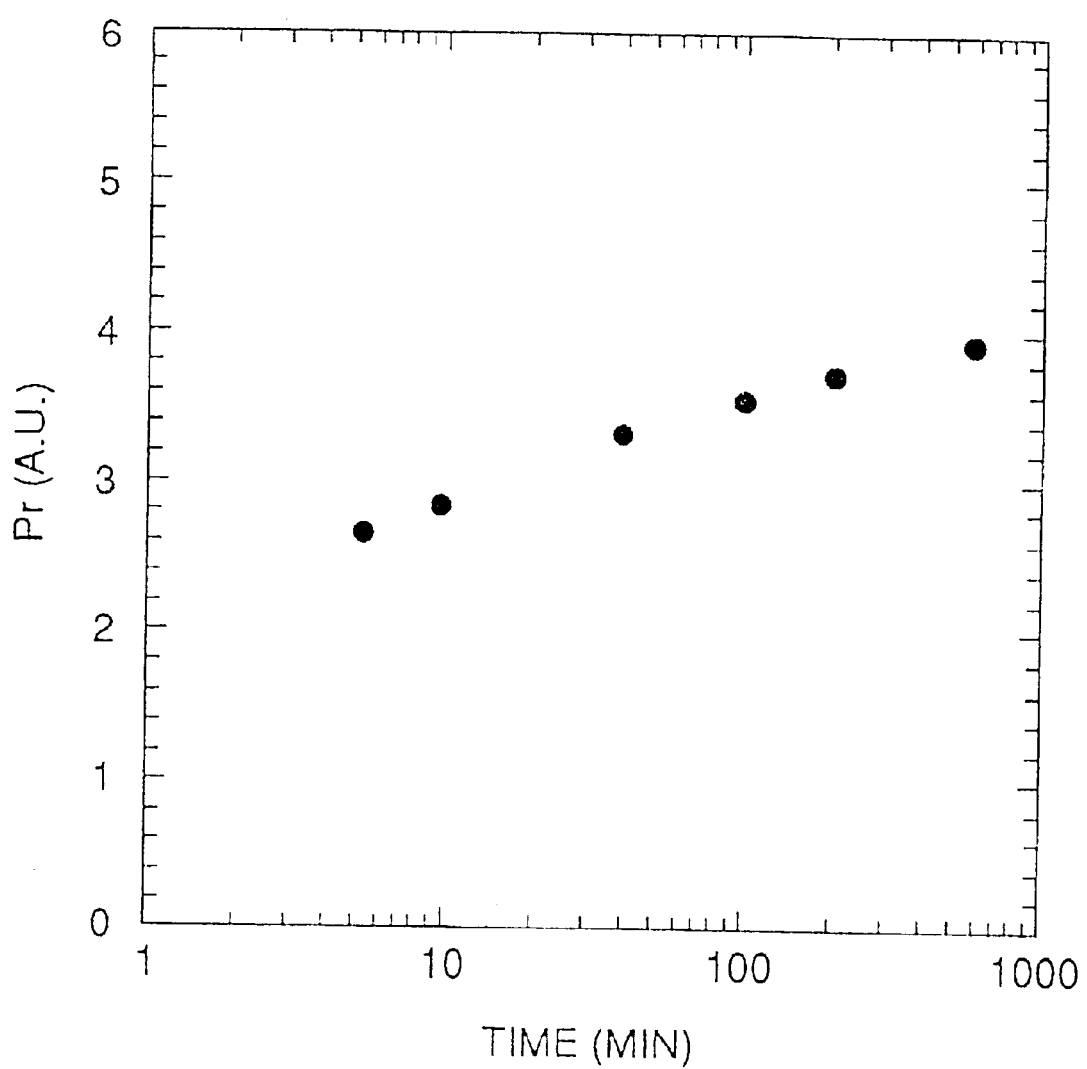
FIG. 12 is a graph showing a relationship for crystal-1 between the voltage application time and Pr (spontaneous polarization value)

Further, while the variation of crystal-1 due to the voltage application was observed with the polarizing microscope 21, the electric field vs. polarization characteristic of crystal-1 was analyzed at times with the computer 23. FIG. 11 shows a ferroelectric hysteresis loop of crystal-1 that was obtained after the AC voltage was applied for 100 minutes. FIG. 12 shows a variation of Pr (spontaneous polarization value) due to the application of the AC voltage. As seen from FIG. 12, it became apparent that the application of a voltage improves the ferroelectricity.

Then, a DC voltage of about 500 V (corresponding to an electric field of about 50 kV/cm) was applied to crystal-2 that was mounted on the rotary stage 21a in the direction perpendicular to the c-axis while heating was made by the temperature adjustment device 27 to set the temperature at 200° C. Thereafter, a DC voltage of about 500 V was applied in such a manner that the electric field direction is reversed. At this time, the magnitude of the electric field was about 5.2 times larger than the coercive field. As a result, portions that did not exhibit, before the voltage application, a periodic light and shade response when the crystal was rotated under the crossed Nicols condition were partially changed by the voltage application so as to exhibit a light and shade response.

Then, a variation of crystal-2 was observed with the polarizing microscope 21 and the CCD camera 24 while an AC voltage of 60 Hz and about 500 V (corresponding to an electric field of about 50 kV/cm) was applied in the direction perpendicular to the c-axis and heating was made to set the temperature at 200° C. The voltage application caused the portions that did not exhibit a periodic light and shade response when the crystal was rotated under the crossed Nicols condition to be gradually extended perpendicularly and thinned to the voltage application direction, and their areas to gradually decrease. Whereas before the voltage application the portions that exhibited a light and shade response accounted for about 85% of the entire body, after the application of the AC voltage for about 120 minutes such portions accounted for more than about 99% of the entire body. Also as for the ferroelectric hysteresis loop of crystal-2, results similar to those with crystal-1 were obtained.

It was confirmed from the above results that the voltage application changes portions that did not exhibit ferroelectricity so that they exhibit ferroelectricity and hence the ferroelectric characteristic is improved as a whole.

Embodiment 2

Figure 13:
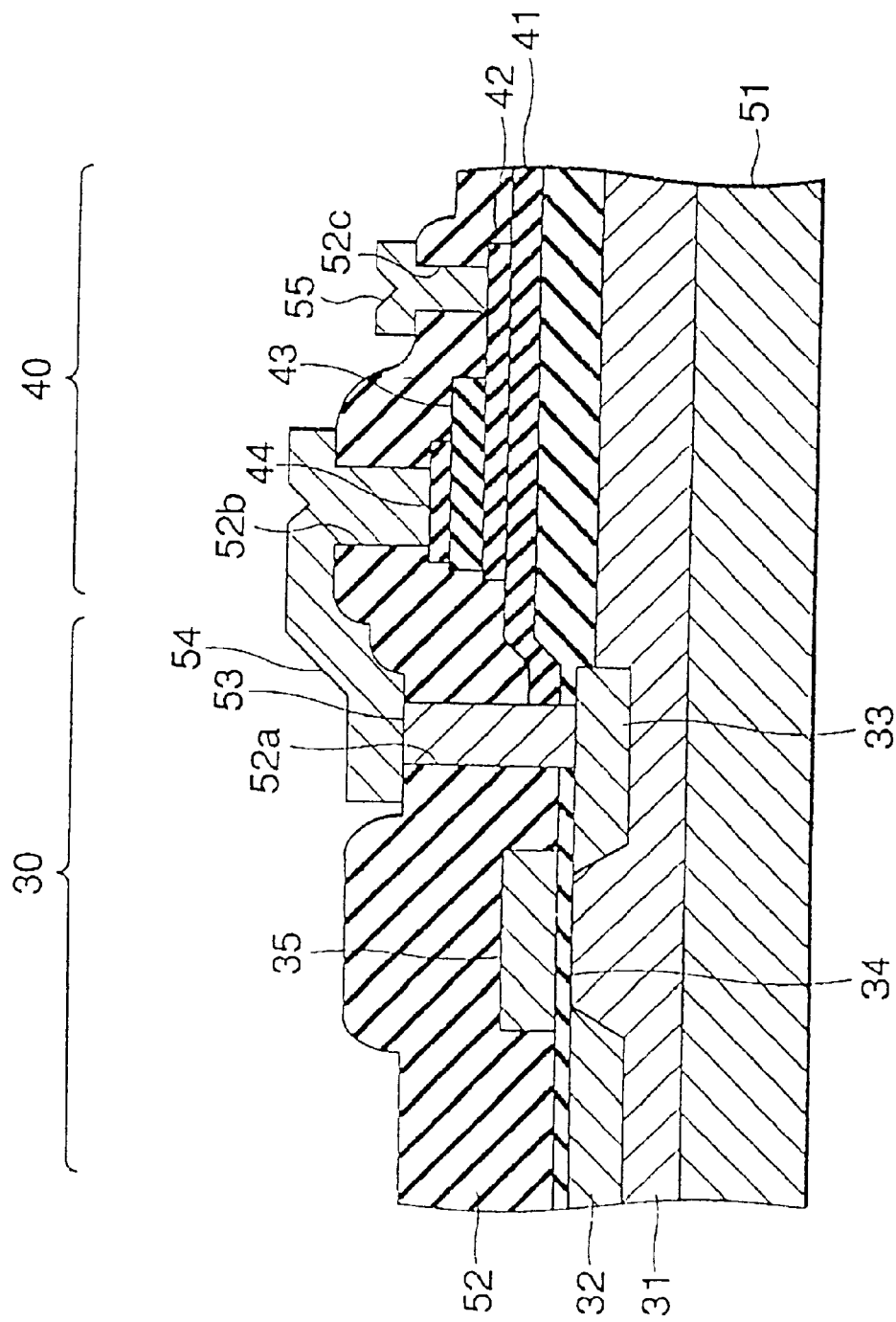
FIG. 13 shows the configuration of a memory cell according to a second embodiment of the invention.

FIG. 13 shows the configuration of a memory cell according to this embodiment, which is composed of a switching transistor 30 and a memory device 40. The transistor 30 is a MOS (metal-oxide-semiconductor) transistor in which a p-well layer 31 doped with an impurity such as boron (B) is formed on a semiconductor substrate (for instance, an n-type silicon (Si) semiconductor substrate) 51. A source electrode 32 that is an $n^+$ layer doped with an impurity such as phosphorus (P) is formed in a source electrode forming region of the p-well layer 31, and a drain electrode 33 that is also an $n^+$ layer is formed in a drain electrode forming region of the p-well layer 31. A proper gap is formed between the source electrode 32 and the drain electrode 33, and a gate electrode 35 made of polysilicon, for instance, is formed above the gap with a gate insulating film 34 of silicon dioxide ($SiO_2$) interposed in between.

As for the memory device 40, a bottom electrode 42 made of a proper metal such as aluminum (Al) is formed on a memory device forming region of the semiconductor substrate 51 with an interlayer insulating film 41 of silicon dioxide interposed in between. A ferroelectric film 43 that is a ferroelectric such as an oxide having a layered crystal structure that is composed of bismuth, strontium, tantalum, and oxygen is formed on part of the bottom electrode 42. A top electrode 44 made of a proper metal such as aluminum is formed on the ferroelectric film 43. That is, in the memory device 40, a pair of electrodes, i.e., the bottom electrode 42 and the top electrode 44, are connected to the ferroelectric film 43.

The ferroelectric constituting the ferroelectric film 43 is such that 98% or more of its section to which a voltage is to be applied via the top electrode 44 and the bottom electrode 42 exhibit ferroelectricity. Where the ferroelectric film 43 is made of an oxide having a layered crystal structure that is composed of bismuth, strontium, tantalum, and oxygen, it may be either a single crystal or a polycrystal. However, the c-axis should be set perpendicular to the voltage application direction.

An interlayer insulating film 52 made of silicon dioxide is formed on the transistor 30 and the memory device 40. A contact hole 52a for contact to the drain electrode 33, a contact hole 52b for contact to the top electrode 44, and a contact hole 52c for contact to the bottom electrode 42 are formed through the interlayer insulating film 52.

A pickup electrode 53 made of polysilicon, for instance, is formed on a portion of the drain electrode 33 exposed by the contact hole 52a. An interconnection 54 made of a proper metal such as aluminum is formed on the pickup electrode 53 and a portion of the top electrode 44 exposed by the contact hole 52b so as to electrically connect the top electrode 44 and the pickup electrode 53 (i.e., the drain electrode 33). Further, an interconnection 55 made of a proper metal such as aluminum is formed on a portion of the bottom electrode 42 exposed by the contact hole 52c so as to electrically connect the bottom electrode 42 to another device (not shown).

Although not shown in FIG. 13, contact holes for contact to the source electrode 32 and the gate electrode 35, respectively, are formed through the interlayer insulating film 52. Given interconnections are connected to the source electrode 32 and the gate electrode 35 via the contact holes, respectively. When a voltage is applied to the gate electrode 35, current flows between the source electrode 32 and the drain electrode 33.

For example, the memory cell having the above configuration can be manufactured in the following manner.

First, a p-well layer 31 is formed on a semiconductor substrate 51 by implanting an impurity such as boron. Then, $n^+$ layers as the source electrode 32 and the drain electrode 33 are formed by implanting an impurity such as phosphorus selectively, i.e., into a source electrode forming region and a drain electrode forming region. Subsequently, a gate oxide film 34 is formed by oxidizing the surface of the p-well layer 31 in which the source electrode 32 and the drain electrode 33 have been formed. Thereafter, a gate electrode 35 is formed by laying a polysilicon film on the gate oxide film 34 selectively, i.e., between the source electrode 32 and the drain electrode 33, by CVD (chemical vapor deposition). A transistor 30 is thus formed.

After the formation of the transistor 30, an interlayer insulating film 41 is formed on its surface. Then, a bottom electrode 42 is formed by evaporating a metal film of aluminum, for instance, selectively, i.e., in a memory device forming region. Subsequently, a ferroelectric film 43 is formed by laying a thin film of ferroelectric selectively, i.e., on part of the bottom electrode 42 (ferroelectric film forming step). Where the ferroelectric film 43 is an oxide having a layered crystal structure that is composed of bismuth, strontium, tantalum, and oxygen, a crystal of the oxide having a layered crystal structure may be deposited by a vapor-phase method or may be formed by MOCVD, MOD (metal organic decomposition), a sol-gel method, sputtering, or MBE (molecular beam epitaxy).

After the ferroelectric film 43 has been formed in the above manner, a top electrode 44 is formed by evaporating a metal film of aluminum, for instance, selectively on the ferroelectric film 43. Thereafter, a voltage is applied to the ferroelectric film 43 via the top electrode 44 and the bottom electrode 42 (voltage application step). As a result, strains of crystal lattices existing in the voltage application section of the ferroelectric film 43 are corrected at least partially. That is, portions that did not exhibit ferroelectricity at all or did not exhibit superior ferroelectricity due to such large strains that the symmetry of crystal lattices is lost come to exhibit superior ferroelectricity.

The voltage applied in the voltage application step may be either an AC voltage or a DC voltage. Where a DC voltage is used, pulses to cause opposite electric field directions are applied alternately. It is preferable that the magnitude of the application voltage be such as to cause an electric field 1.5 times or more stronger than the coercive field or larger than the memory drive voltage. A larger application voltage can provide a higher effect. During the voltage application, the ferroelectric film 43 may be heated properly or kept at the room temperature without heating it (i.e., no temperature adjustment is performed). During the voltage application, the coercive field decreases as the temperature increases. Therefore, by increasing the application voltage, a profound effect can be obtained even with a low voltage. However, since a high temperature may adversely affect other devices, it is preferable that the temperature not be set too high. The memory device 40 is formed in the above manner.

After the formation of the memory device 40, an interlayer insulating film 52 is formed on the memory device 40 and the transistor 30 and respective contact holes 52a–52c for exposing parts of the surfaces of the drain electrode 33, the top electrode 44, and the bottom electrode 42 and respective contact holes (not shown) for exposing parts of the surfaces of the source electrode 32 and the gate electrode 35 are formed. Then, a pickup electrode 53 is formed by burying a polysilicon layer selectively, that is, in the contact hole 52a by CVD, for instance. Subsequently, interconnections 54, 55, etc. are formed by evaporating a metal film of aluminum, for instance. As a result, the transistor 30 and the memory device 40 are electrically connected to each other, whereby a memory cell is completed as shown in FIG. 13.

The memory cell that is manufactured as described above operates in the following manner.

In the memory cell, when a voltage is applied to the gate electrode 35 of the transistor 30, the transistor 30 as a switch is turned on and current flows between the source electrode 32 and the drain electrode 33. As a result, current flows into the memory device 40 via the pickup electrode 53 and the interconnection 54 and a voltage is applied between the top electrode 44 and the bottom electrode 42. Upon the application of the voltage to the memory device 40, polarization occurs in the ferroelectric film 43. The voltage vs. polarization characteristic of the ferroelectric film 43 has hysteresis. Storage or readout of data "1" or "0" is performed by utilizing the hysteresis. Being made of a ferroelectric in which 98% or more of the voltage application section exhibits ferroelectricity, the ferroelectric film 43 exhibits superior characteristics. Therefore, the data storage or readout can be performed with high accuracy.

In the memory device of this embodiment, since the ferroelectric film 43 is made of a ferroelectric in which 98% or more of the voltage application section exhibits ferroelectricity, the characteristics can be improved and a variation among devices can be reduced.

In the manufacturing of the memory device of this embodiment, the application of a voltage to the ferroelectric film 43 can correct strains of crystal lattices existing in the ferroelectric film 43. As a result, portions that did not exhibit ferroelectricity at all or did not exhibit superior ferroelectricity due to such large strains that the symmetry of crystal lattices is lost can be changed so as to exhibit superior ferroelectricity. Therefore, the memory device of this embodiment can be realized easily.

Although the invention has been described above in the form of embodiments, the invention is not limited to the embodiments and various modifications are possible within the range of equivalence. For example, although the first embodiment is directed to the ferroelectric that is the oxide having a layered crystal structure composed of bismuth, the first element Me, the second element, and oxygen (the first element Me is at least one element selected from the group consisting of sodium, potassium, calcium, barium, strontium, lead, and bismuth, and the second element R is at least one element selected from the group consisting of iron, titanium, niobium, tantalum, and tungsten), other ferroelectrics can also be used in the invention.

Although in the first embodiment the specific embodiment was described which was directed to the ferroelectric of BiSTa, similar results can be obtained with other oxides having a layered crystal structure that are composed of bismuth, the first element Me, the second element, and oxygen (the first element Me is at least one element selected from the group consisting of sodium, potassium, calcium, barium, strontium, lead, and bismuth, and the second element R is at least one element selected from the group consisting of iron, titanium, niobium, tantalum, and tungsten).

Further, although the first embodiment is directed to the case where after the crystal growth step a voltage is applied to a crystal that has grown, the invention encompasses a case where a voltage is applied after at least part of a crystal to constitute a ferroelectric has grown. The invention also encompasses a case of applying a voltage to part of a crystal that has grown in addition to the case of applying a voltage to the entire crystal.

Further, although the second embodiment is directed to the case where a voltage is applied to the ferroelectric film 43 after the bottom electrode 42, the ferroelectric film 43, and the top electrode 44 have been formed, a voltage may be applied at any time after at least part of the ferroelectric film 43 has been formed.

In addition, although the second embodiment is directed to the memory cell that is composed of the transistor 30 and the memory device 40, the invention is broadly applied to memory devices in which a pair of electrodes are connected to a ferroelectric. Therefore, the transistor 30 is not limited to the MOS transistor and may be the MESFET (metal semiconductor field-effect transistor) and other kinds of transistors.

Further, although the second embodiment is directed to a single memory cell, the invention can similarly be applied to an LSI (large scale integrated circuit) memory in which a plurality of memory cells are integrated.

As described above, according to the ferroelectric of the invention, the ferroelectric characteristic can be improved as a whole because 98% or more of the entire body exhibits ferroelectricity. Therefore, by forming a ferroelectric, nonvolatile memory device by using this ferroelectric, advantages are obtained that the quality of the memory device can be improved and a variation in quality among memory device products can be reduced.

According to the memory device of the invention, since 98% or more of the section of the ferroelectric film to which a voltage is applied is a ferroelectric that exhibits ferroelectricity, advantages are provided that the characteristics can be improved and a variation among memory devices can be reduced.

Further, according to the ferroelectric manufacturing method of the invention, since after at least part of a crystal to constitute the ferroelectric is grown a voltage is applied to at least part of the crystal, strains of crystal lattices existing in the crystal can be corrected. Therefore, portions that did not exhibit ferroelectricity at all or did not exhibit superior ferroelectricity due to such large strains that the symmetry of crystal lattices is lost can be caused to exhibit superior ferroelectricity. Therefore, advantages are obtained that the characteristics can be improved and the ferroelectric of the invention can be realized easily.

In addition, according to the memory device manufacturing method of the invention, since after at least part of a ferroelectric film is formed a voltage is applied to at least part of the ferroelectric film, strains of crystal lattices existing in the ferroelectric film can be corrected. Therefore, advantages are obtained that the characteristics can be improved and the memory device of the invention can be realized easily.

What is claimed is:

1. A method for making a ferroelectric, said method comprising the steps of:
    a crystal growth step of growing a crystal that is to constitute the ferroelectric; and
    a voltage application step of applying, after at least part of the crystal has been grown, a voltage to at least part of the crystal to at least partially reduce strains of crystal lattices existing in the crystal to impart ferroelectricity to such part, the voltage having a magnitude so as to cause an electric field that is at least 1.5 times stronger than a coercive field of the ferroelectric.

2. The method according to claim 1, wherein an AC voltage is applied in the voltage application step.

3. The method according to claim 1, wherein in the voltage application step at least one pair of DC voltage pulses to cause opposite electric field directions are applied alternately.

4. The method according to claim 1, wherein the voltage application step is executed while heating is performed.

5. The method according to claim 1, wherein the voltage application step is executed while no temperature adjustment is made.

6. The method according to claim 1, wherein the ferroelectric is an oxide having a layered crystal structure that is composed of bismuth, a first element, a second element, and oxygen, where the first element is at least one element selected from the group consisting of sodium, potassium, calcium, barium, strontium, lead, and bismuth and the second element is at least one element selected from the group consisting of iron, titanium, niobium, tantalum, and tungsten.

7. The manufacturing method according to claim 6, wherein the first element is strontium and the second element is tantalum.

8. A method for manufacturing a memory device in which a pair of electrodes are connected to a ferroelectric film, said method comprising the steps of:
    a ferroelectric forming step of forming a ferroelectric film; and
    a voltage application step of applying, after at least a part of the ferroelectric film has been formed, a voltage to at least part of the ferroelectric film to at least partially reduce strains of crystal lattices existing in the ferroelectric film to impart ferroelectricity to such part, the voltage having a magnitude so as to cause an electric field that is at least 1.5 times stronger than a coercive field of the ferroelectric.

9. The method according to claim 8, wherein a voltage higher than or equal to a memory drive voltage is applied in the voltage application step.

10. The method according to claim 8, wherein the ferroelectric is an oxide having a layered crystal structure that is composed of bismuth, a first element, a second element, and oxygen, where the first element is at least one element selected from the group consisting of sodium, potassium, calcium, barium, strontium, lead, and bismuth and the second element is at least one element selected from the group consisting of iron, titanium, niobium, tantalum, and tungsten.

11. The method according to claim 8, wherein the first element is strontium and the second element is tantalum.

* * * * *